(12) United States Patent
Lue

(10) Patent No.: US 8,486,791 B2
(45) Date of Patent: Jul. 16, 2013

(54) MUFTI-LAYER SINGLE CRYSTAL 3D STACKABLE MEMORY

(75) Inventor: Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 194 days.

(21) Appl. No.: 13/223,116

(22) Filed: Aug. 31, 2011

(65) Prior Publication Data
US 2012/0181654 A1 Jul. 19, 2012

Related U.S. Application Data

(60) Provisional application No. 61/434,293, filed on Jan. 19, 2011.

(51) Int. Cl.
*H01L 21/336* (2006.01)

(52) U.S. Cl.
USPC ........ 438/294; 257/E21.677; 257/324; 257/E21.645; 257/E21.24; 365/185.05; 438/458

(58) Field of Classification Search
USPC ............ 438/294, 458–459; 257/324, E21.645–E21.695, E21.24–E21.25
See application file for complete search history.

(56) References Cited

U.S. PATENT DOCUMENTS

| | | | |
|---|---|---|---|
| 5,374,564 A | 12/1994 | Bruel | |
| 5,993,667 A | 11/1999 | Overman | |
| 6,034,882 A | 3/2000 | Johnson et al. | |
| 6,906,361 B2 | 6/2005 | Zhang | |
| 6,906,940 B1 | 6/2005 | Lue | |
| 7,081,377 B2 | 7/2006 | Cleeves | |
| 7,129,538 B2 | 10/2006 | Lee et al. | |
| 7,177,169 B2 | 2/2007 | Scheuerlein | |
| 7,274,594 B2 | 9/2007 | Pascucci et al. | |
| 7,315,474 B2 | 1/2008 | Lue | |
| 7,382,647 B1 | 6/2008 | Gopalakrishnan | |
| 7,420,242 B2 | 9/2008 | Lung | |
| 7,473,589 B2 | 1/2009 | Lai et al. | |
| 7,709,334 B2 | 5/2010 | Lai et al. | |
| 7,851,849 B2 | 12/2010 | Kiyotoshi | |
| 2005/0280061 A1 | 12/2005 | Lee | |
| 2007/0140001 A1 | 6/2007 | Motoi et al. | |
| 2008/0073635 A1 | 3/2008 | Kiyotoshi et al. | |
| 2008/0096327 A1 | 4/2008 | Lee et al. | |
| 2008/0101109 A1 | 5/2008 | Haring-Bolivar et al. | |
| 2008/0180994 A1 | 7/2008 | Katsumata et al. | |

(Continued)

FOREIGN PATENT DOCUMENTS

| EP | 1936681 A1 | 6/2008 |
|---|---|---|
| EP | 2048709 A2 | 4/2009 |

OTHER PUBLICATIONS

Soon-Moon Jung et al. "Three Dimensionally Stacked NAND Flash Memory Technology Using Stacking Single Crystal Si Layers on ILD and TANOS Structure for Beyond 30nm Node," Electron Devices Meeting, 2006, IEDM International, Dec. 11-13, 2006, pp. 1-4.

(Continued)

*Primary Examiner* — Julio J Maldonado
*Assistant Examiner* — Sonya D McCall Shepard
(74) *Attorney, Agent, or Firm* — Haynes Beffel & Wolfeld LLP

(57) ABSTRACT

Technology is described herein for manufacturing a three-dimensional 3D stacked memory structure having multiple layers of single crystal silicon or other semiconductor. The multiple layers of single crystal semiconductor are suitable for implementing multiple levels of high performance memory cells.

25 Claims, 13 Drawing Sheets

U.S. PATENT DOCUMENTS

| | | |
|---|---|---|
| 2008/0247230 A1 | 10/2008 | Lee et al. |
| 2009/0097321 A1 | 4/2009 | Kim et al. |
| 2009/0117707 A1 | 5/2009 | Shimomura et al. |
| 2009/0184360 A1 | 7/2009 | Jin et al. |
| 2010/0120226 A1 | 5/2010 | Yamazaki et al. |
| 2010/0270593 A1 | 10/2010 | Lung et al. |
| 2011/0286283 A1 | 11/2011 | Lung et al. |
| 2012/0007167 A1 | 1/2012 | Hung et al. |

OTHER PUBLICATIONS

Jiyoung Kim et al., Novel 3-D Structure for Ultra High Density Flash Memory with VRAT (Vertical-Recess-Array-Transistor) and PIPE (Planarized Integration on the same PlanE), 2008 Symposium VLSI Technology Digest of Technical Papers, pp. 122-123.

Mark Johnson et al. "512-Mb PROM With a Three-Dimensional Array of Diode/Antifuse Memory Cells," IEEE Journal of Solid-State Circuits, vol. 38, No. 11, Nov. 2003, pp. 1920-1928.

Erh-Kun Lai et al. "A Multi-Layer Stackable Thin-Film Transistor (TFT) NAND-Type Flash Memory," 2006 IEEE, pp. 1-4.

H. Tanaka et al. "Bit Cost Scalable Technology with Punch and Plug Process for Ultra High Density Flash Memory," Jun. 12-14, 2007, Symposium on VLSI Technology Digest of Technical Papers, pp. 14-15.

Tzu-Hsuan Hsu et al. "Study of Sub-30nm Thin Film Transistor (TFT) Charge-Trapping (CT) Devices for 3D NAND Flash Application," IEEE 2009, pp. 27.4.1-27.4.4.

A. Hubert et al. "A Stacked SONOS Technology, Up to 4 Levels and 6nm Crystalline Nanowires, With Gate-All-Around or Independent Gates (Flash), Suitable for Full 3D Integration," IEDM 2009, pp. 27.6.1-27.6.4.

Hang-Ting Lue et al. "A Novel Buried-channel FinFET BE-SONOS NAND Flash with Improved Memory Windows and Cycling Endurance," 2009 Symposium on VLSI Technology Digest of Technical Papers, pp. 224-225.

Wonjoo Kim et al. "Multi-Layered Vertical Gate NAND Flash Overcoming Stacking Limit for Terabit Density Storage," 2009 Symposium on VLSI Technology Digest of Technical Papers, pp. 188-189.

Jaehoon Jang et al. "Vertical Cell Array Using TCAT (Terabit Cell Array Transistor) Technology for Ultra High Density NAND Flash Memory," 2009 Symposium on VLSI Technology Digest of Technical Papers, pp. 192-193.

Ryota Katsumata et al. "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Bipul C. Paul et al. "Impact of a Process Variation on Nanowire and Nanotube Device Performance," IEEE Transactions on Electron Devices, vol. 54, No. 9, Sep. 2007, pp. 2369-2376.

Sung-Jin Choi et al. "Performance Breakthrough in NOR Flash Memory With Dopant-Segregated Schottky-Barrier (DSSB) SONOS Devices," 2009 Symposium on VLSI Technology Digest of Technical Papers, pp. 222-223.

Sheng-Chih Lai et al. "Highly Reliable MA BE-SONOS (Metal-Al2O3 Bandgap Engineered SONOS) Using a SiO2 Buffer Layer," VLSI Technology, Systems and Applications 2008, VLSI-TSA International Symposium on Apr. 21-23, 2008, pp. 58-59.

Yoshiaki Fukuzumi et al. "Optimal Integration and Characteristics of Vertical Array Devices for Ultra-High Density, Bit-Cost Scalable Flash Memory," IEEE 2007, pp. 449-452.

Jiyoung Kim et al. "Novel Vertical-Stacked-Array-Transistor (VSAT) for Ultra-High-Density and Cost-Effective NAND Flash Memory Devices and SSD (Solid State Drive)", 2009 Symposium on VLSI Technology Digest of Technical Papers, pp. 186-187.

MUFTI-LAYER SINGLE CRYSTAL 3D STACKABLE MEMORY

CROSS-REFERENCE TO RELATED APPLICATIONS

This application claims the benefit of U.S. Provisional Application No. 61/434,293 entitled "Methods for Manufacturing a Multi-Layer Single-Crystal 3D Stackable Memory" filed 19 Jan. 2011, which is incorporated by reference herein.

BACKGROUND

1. Field

The present technology relates to three-dimensional memory devices, and methods for manufacturing such devices.

2. Description of Related Art

In the manufacturing of high density memory devices, the amount of data per unit area can be a critical factor. Thus, as the critical dimensions of the memory devices approach technology limits, techniques for stacking multiple levels of memory cells have been proposed in order to achieve greater storage density and lower costs per bit.

For example, a three-dimensional stacked memory device with anti-fuse diode memory cells is described in Johnson et al., "512-Mb PROM with a Three-Dimensional Array of Diode/Anti-fuse Memory Cells" IEEE J. of Solid-State Circuits, vol. 38, no. 11, November 2003. In the design described in Johnson et al., multiple layers of word lines and bit lines are provided, with memory elements at the cross-points. The memory elements comprise a p+ polysilicon anode connected to a word line, and an n-polysilicon cathode connected to a bit line, with the anode and cathode separated by anti-fuse material. Although the benefits of high density are achieved using the design described in Johnson et al., diodes having both the anode and cathode regions made of polycrystalline silicon may have unacceptably high off current. Diodes having both regions made of single crystal silicon may provide a suitably low off current, but processes for making such devices are complex.

A three-dimensional stacked memory device structure that provides vertical NAND cells in a charge trapping memory technology is described in Tanaka et al., "Bit Cost Scalable Technology with Punch and Plug Process for Ultra High Density Flash Memory", 2007 Symposium on VLSI Technology Digest of Technical Papers; 12-14 Jun. 2007, pages: 14-15. The structure described in Tanaka et al. includes a multi-gate field effect transistor structure having a vertical channel which operates like a NAND gate, using silicon-oxide-nitride-oxide-silicon SONOS charge trapping technology to create a storage site at each gate/vertical channel interface. The memory structure is based on a pillar of polycrystalline silicon arranged as the vertical channel for the multi-gate cell. However, it has been observed that grain boundaries and intragranular defects within channels of polycrystalline silicon can adversely affect transistor performance. For example, device characteristics such as threshold voltage, leakage current and tranconductance can be poor compared to devices having single crystal channels.

It is desirable to provide a structure for three-dimensional integrated circuit memory, including memory cells using single crystal semiconductor elements.

SUMMARY

Technology is described herein for manufacturing a three-dimensional 3D stacked memory structure having multiple layers of single crystal silicon or other semiconductor. The multiple layers of single crystal semiconductor are suitable for implementing multiple levels of high performance memory cells.

Techniques for manufacturing 3D stacked memory are described in conjunction with multiple single crystal layer transfer steps, to stack multiple layers of single crystal semiconductor material separated by insulating material.

The stacked layers of single crystal can be utilized with a variety of different memory elements, including read only, floating gate, charge trapping, etc. The stacked layers of single crystal can also be utilized in a variety of different 3D memory architectures.

A method for manufacturing a memory device as described herein includes bonding a first single crystal semiconductor body to a surface of a first layer of insulating material. The first semiconductor body is split on a plane generally parallel to the surface of the first layer of insulating material, leaving a first layer of single crystal semiconductor bonded on the first layer of insulating material. A second layer of insulating material is formed on the first layer of single crystal semiconductor material. A second single crystal semiconductor body is then bonded to a surface of the second layer of insulating material. The second single crystal semiconductor body is then split on a plane generally parallel to the surface of the second layer of insulating material, leaving a second layer of single crystal semiconductor bonded to the second layer of insulating material. This process can be repeated to form the desired number of layers. The multiple layers of single crystal semiconductor are then processed to form a 3D memory array.

Other aspects and advantages of the present technology can be seen on review of the drawings, the detailed description and the claims, which follow.

DETAILED DESCRIPTION

A detailed description of embodiments of the present technology is provided with reference to the Figures.

FIGS. 1-9 illustrate stages in a process flow for forming layers of single crystal semiconductor material separated by insulating material layers.

Figure 1:
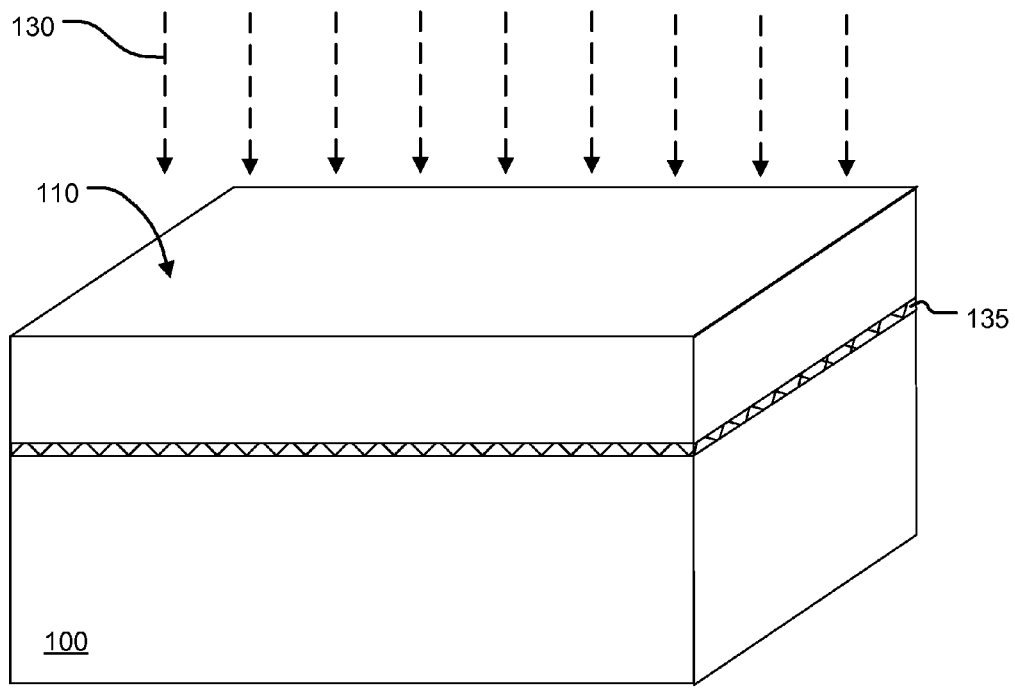
FIG. 1 illustrates a stage in a process for manufacturing layers of single crystal semiconductor material separated by insulating material layers.

FIG. 1 shows the result of the formation of a single crystal semiconductor body 100 of silicon or other semiconductor material. The single crystal semiconductor body 100 is implanted with ions 130 of Hydrogen or a rare gas element, to form a defect layer 135 a predetermined depth from the top surface 110 of the first single crystal semiconductor body 100. In the illustrated embodiment, surface Hydrogen ion implantation is performed at a dosage range from 3e16 to 1e17 $cm^{-2}$ at a temperature range from 225 to 300 degrees Celsius. In some embodiments, the implantation of the ions 130 can be performed in connection with the processes described for example in U.S. Pat. Nos. 5,374,564 and 5,993,667, which are incorporated by reference herein. Other techniques may alternatively be used.

The defect layer 135 is a region of microvoids formed a predetermined depth below the top surface 110 of the single crystal semiconductor body 100 by the ion implantation process. Because of the implantation process, the defect layer 135 can be formed in a plane substantially parallel to the top surface 110, where "substantially" is intended to accommodate manufacturing tolerances which may cause variations in the depth. The term "plane" refers to a surface in which a straight line joining any two of its points lies entirely on that surface.

As described below, the defect layer 135 enables the single crystal semiconductor body 100 to separate during subsequent annealing, so that a single crystal semiconductor material layer above the defect layer 135 is split from the portion below the defect layer 135. The implanted ions can remain in the single crystal semiconductor material of the resulting structure as artifacts of the manufacturing process.

Figure 2:
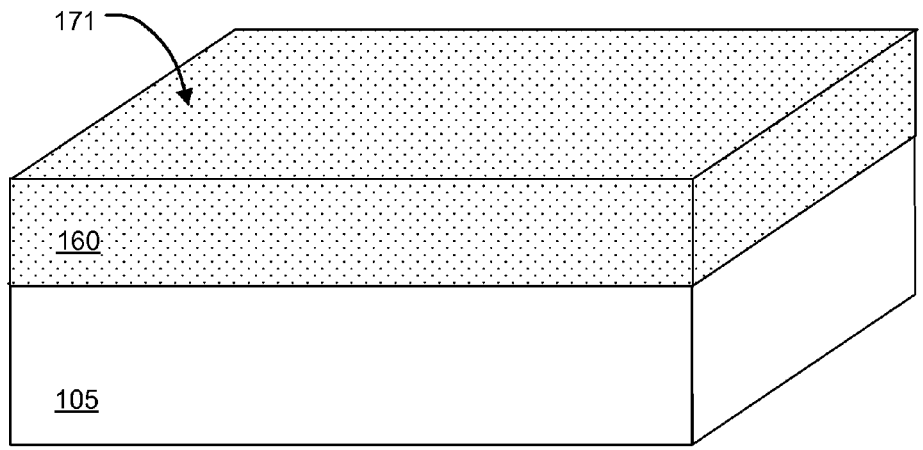
FIG. 2 illustrates a stage in a process for manufacturing layers of single crystal semiconductor material separated by insulating material layers.

FIG. 2 shows the result of the formation of a semiconductor body 105 of silicon or other semiconductor material. As shown in FIG. 2, an insulating layer 160 having a top surface 171 is formed on the semiconductor body 105. In the illustrated embodiment, the insulting layer 160 is silicon dioxide which is thermally grown on the semiconductor body 105.

The semiconductor bodies 100, 105 are also implanted with dopants. Depending upon the implementation, the semiconductor bodies 100, 105 can have n-type or p-type doping. Additional processing may also be performed on the structures illustrated in FIGS. 1 and 2. For example, in some embodiments an insulating layer may also be formed on the top surface 110 of the single crystal semiconductor body 100.

Figure 3:
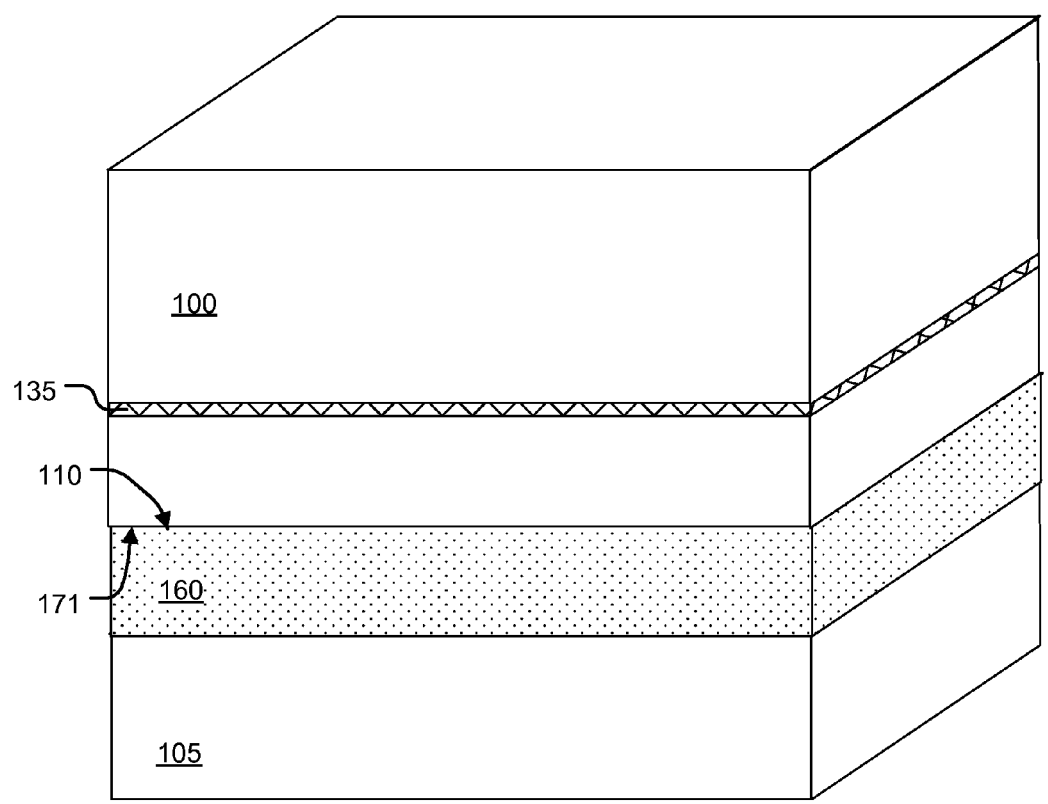
FIG. 3 illustrates a stage in a process for manufacturing layers of single crystal semiconductor material separated by insulating material layers.

FIG. 3 shows the result of cleaning the structures illustrated in FIGS. 1 and 2 and then bonding the top surface 110 of the single crystal semiconductor body 100 to the top surface 171 of the insulting layer 160. In the illustrated embodiment the structures are cleaned using a modified RCA clean, and then bonded using Hydrophilic bonding performed at room temperature. The bonded wafers can be then checked to ensure they are void-free using infra-red spectroscopy and magic mirror observations.

Figure 4:
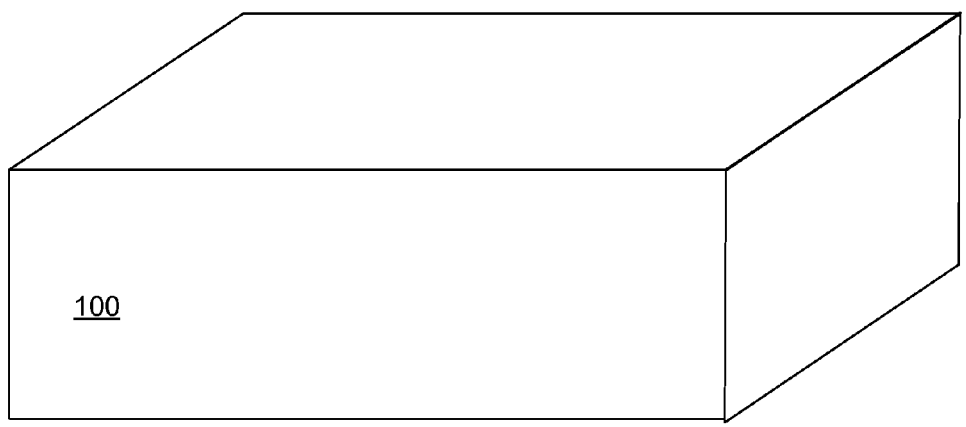
FIG. 4 illustrates a stage in a process for manufacturing layers of single crystal semiconductor material separated by insulating material layers.
Figure 4:
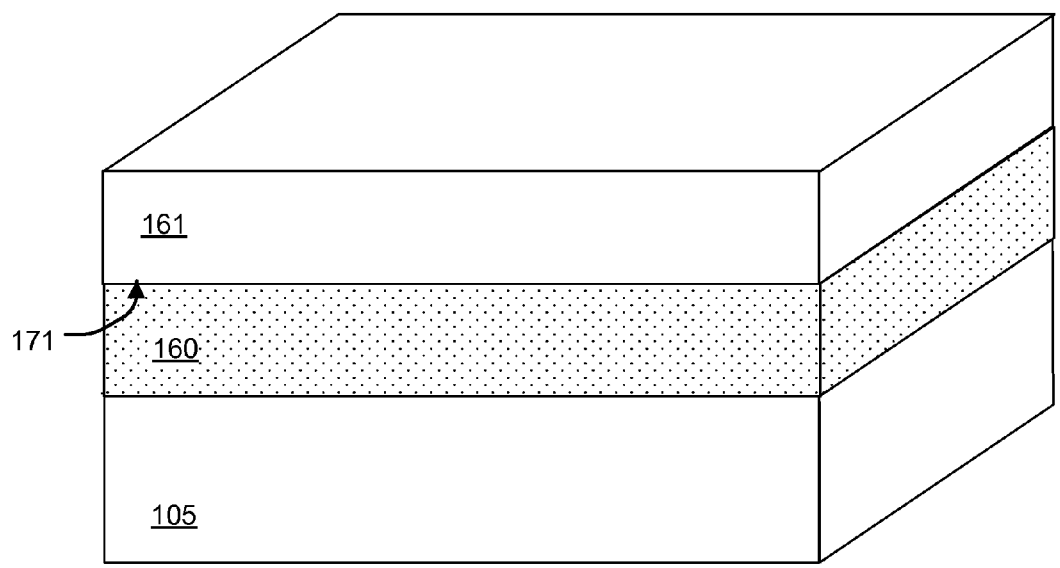

FIG. 4 shows the result of splitting the single crystal semiconductor body 100 on a plane generally parallel to the top surface 171 of the insulting layer 160, so that a portion (semiconductor layer 161) of single crystal semiconductor material remains bonded on the insulating layer 160. The term "generally parallel" is intended to accommodate manufacturing tolerances which may cause variations in the thickness of the semiconductor layer 161.

The split off portion of the single crystal semiconductor body 100 can then be re-used in subsequent single layer transfer steps as described below. Alternatively, a different single crystal semiconductor body may be used in subsequent single layer transfer steps.

In the illustrated embodiment, the splitting of the first semiconductor substrate 100 is induced using a two-step anneal process which causes the single crystal semiconductor body 100 to split at the defect layer 135. The top surface of the semiconductor layer 161 can then be touch polished using for example chemical mechanical polishing (CMP) to reduce the surface roughness.

In some alternative embodiments, the bonding and/or splitting processes may be performed using techniques such as those described in U.S. Patent Application Publication No. 2010/0120226 to Yamazaki et al., and U.S. Patent Application Publication No. 2009/0117707 to Shimomura et al., which are incorporated by reference herein. Other bonding and/or splitting processes for transferring a layer of single crystal semiconductor material may also be used.

Figure 5:
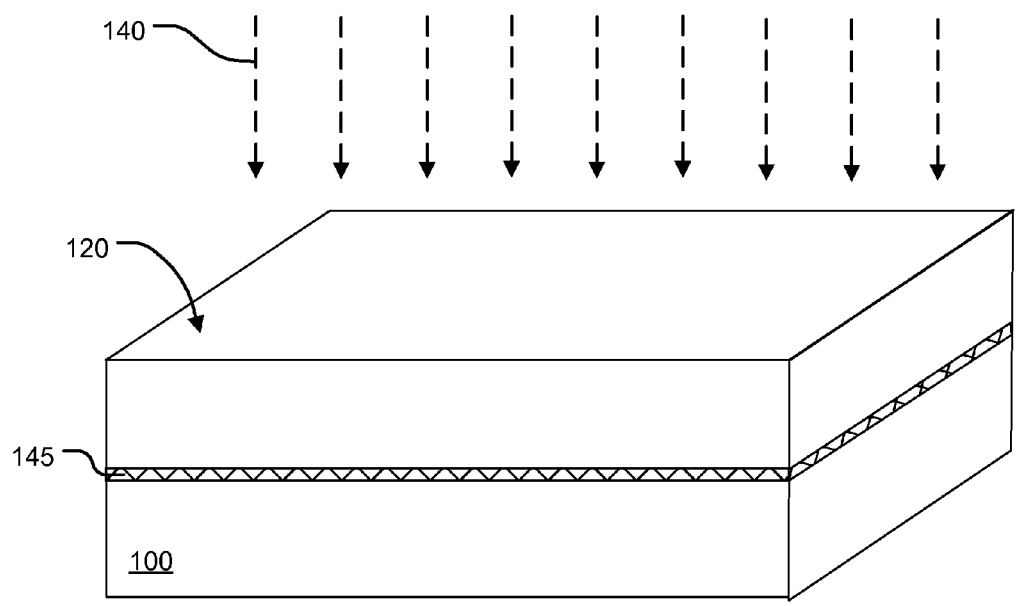
FIG. 5 illustrates a stage in a process for manufacturing layers of single crystal semiconductor material separated by insulating material layers.

FIG. 5 shows the result of implanting ions 140 to form a second defect layer 145 a predetermined depth from the top surface 120 of the remaining portion of single crystal semiconductor body 100. In the illustrated embodiment, the second defect layer 145 is formed by performing the surface Hydrogen ion implantation described above.

Figure 6:
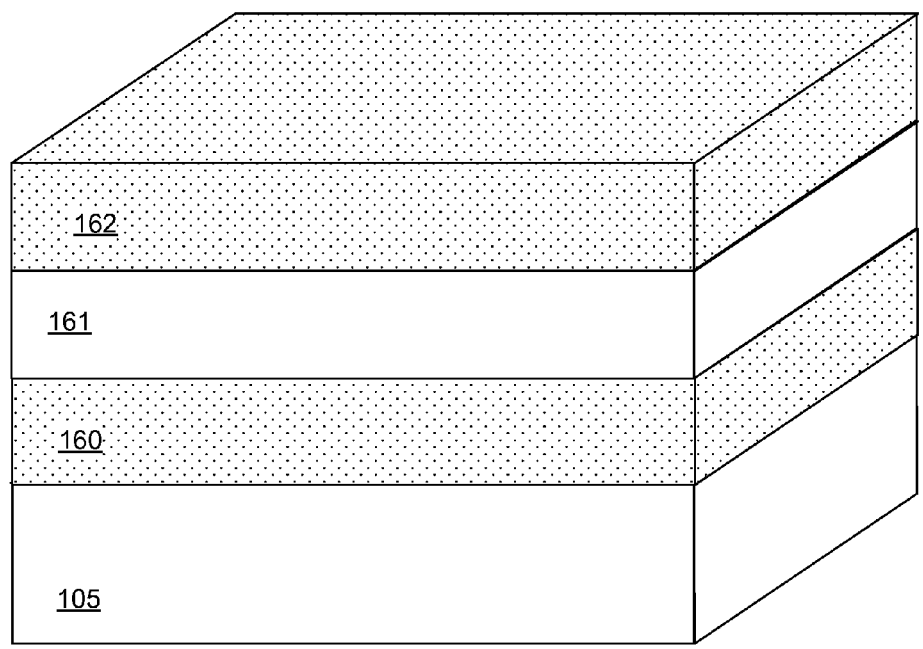
FIG. 6 illustrates a stage in a process for manufacturing layers of single crystal semiconductor material separated by insulating material layers.

FIG. 6 shows the result of the formation of an insulating layer 162 on the semiconductor layer 161. In the illustrated embodiment, the insulating layer 162 is silicon dioxide which is thermally grown on the semiconductor layer 161.

Figure 7:
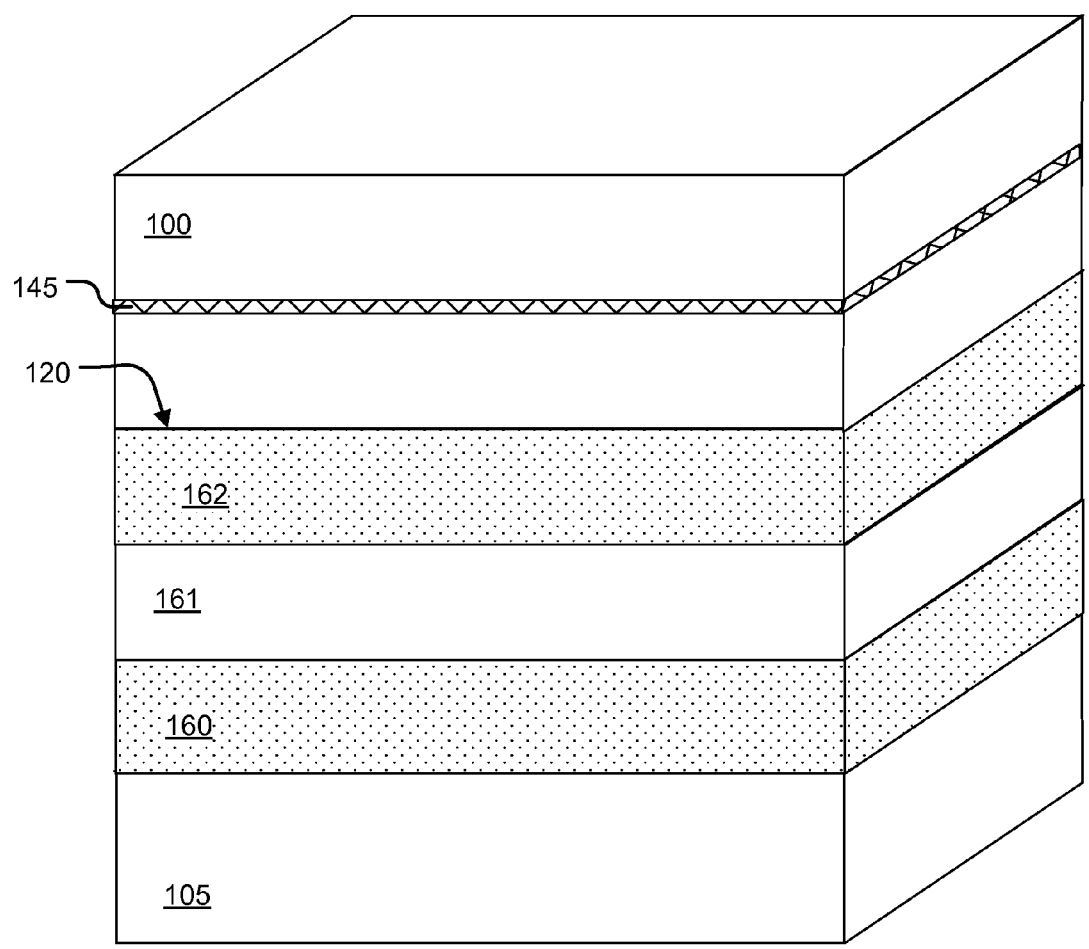
FIG. 7 illustrates a stage in a process for manufacturing layers of single crystal semiconductor material separated by insulating material layers.

FIG. 7 shows the result of cleaning the structures illustrated in FIGS. 5 and 6 and then bonding the top surface 120 of the single crystal semiconductor body 100 to the insulating layer 162.

Figure 8:
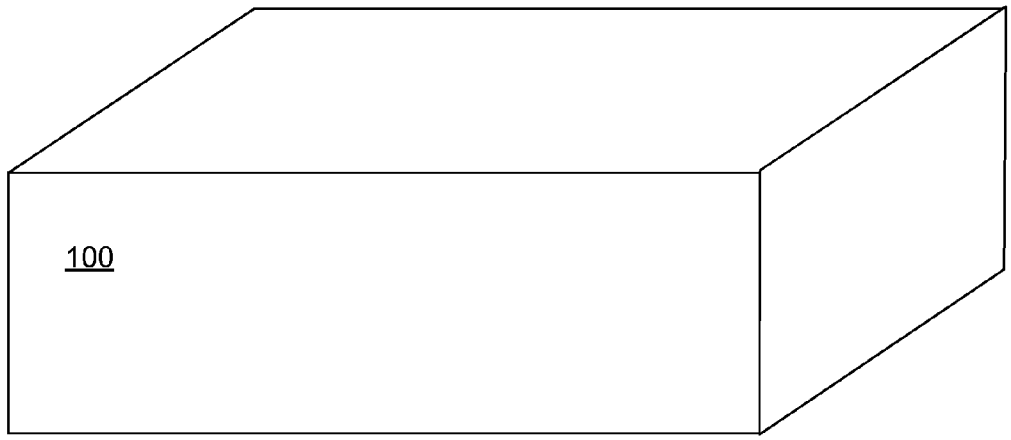
FIG. 8 illustrates a stage in a process for manufacturing layers of single crystal semiconductor material separated by insulating material layers.
Figure 8:
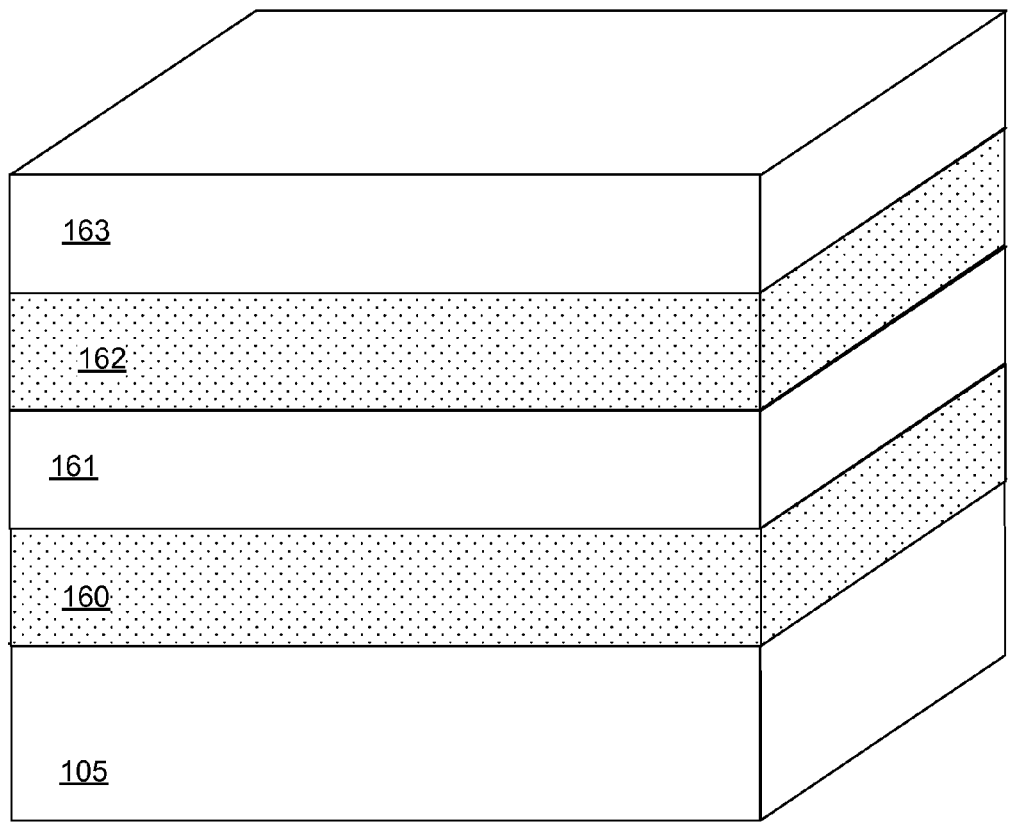

FIG. 8 shows the result of splitting the single crystal semiconductor body 100 at the second defect layer 145 so that semiconductor layer 163 of single crystal semiconductor material remains bonded to the insulating layer 162.

Figure 9:
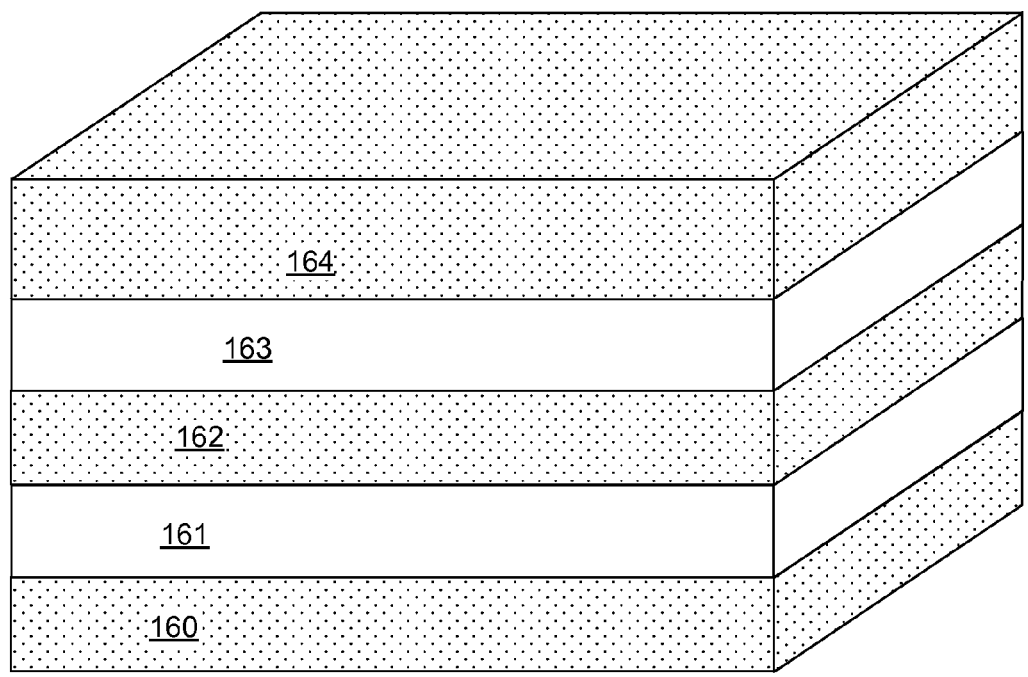
FIG. 9 illustrates a stage in a process for manufacturing layers of single crystal semiconductor material separated by insulating material layers.

FIG. 9 shows the result of the formation of an insulating layer 164 on the semiconductor layer 163. In the structure illustrated in FIG. 9, as well as the subsequent process steps, the semiconductor body 105 underlying the insulating layer 160 is not shown.

In the illustrated example, two layers 161, 163 of single crystal semiconductor material are formed separated by insulating material. The techniques described above can also be repeated to form any number of additional layers of single crystal semiconductor material separated by insulating material.

Next, additional processing is performed on the multi-layer structure illustrated in FIG. 9 to complete the process flow and form a 3D memory array. The processes performed depend upon the configuration and type of memory elements of the 3D memory array. Generally, the processing may include patterning the multi-layer structure to form stacks of single crystal semiconductor material strips, forming conductive lines overlying the stacks, and forming memory elements adjacent the stacks which establish a 3D array of memory cells accessible via the single crystal semiconductor material strips and the conductive lines. Other or different processes can also be performed.

Figure 16:
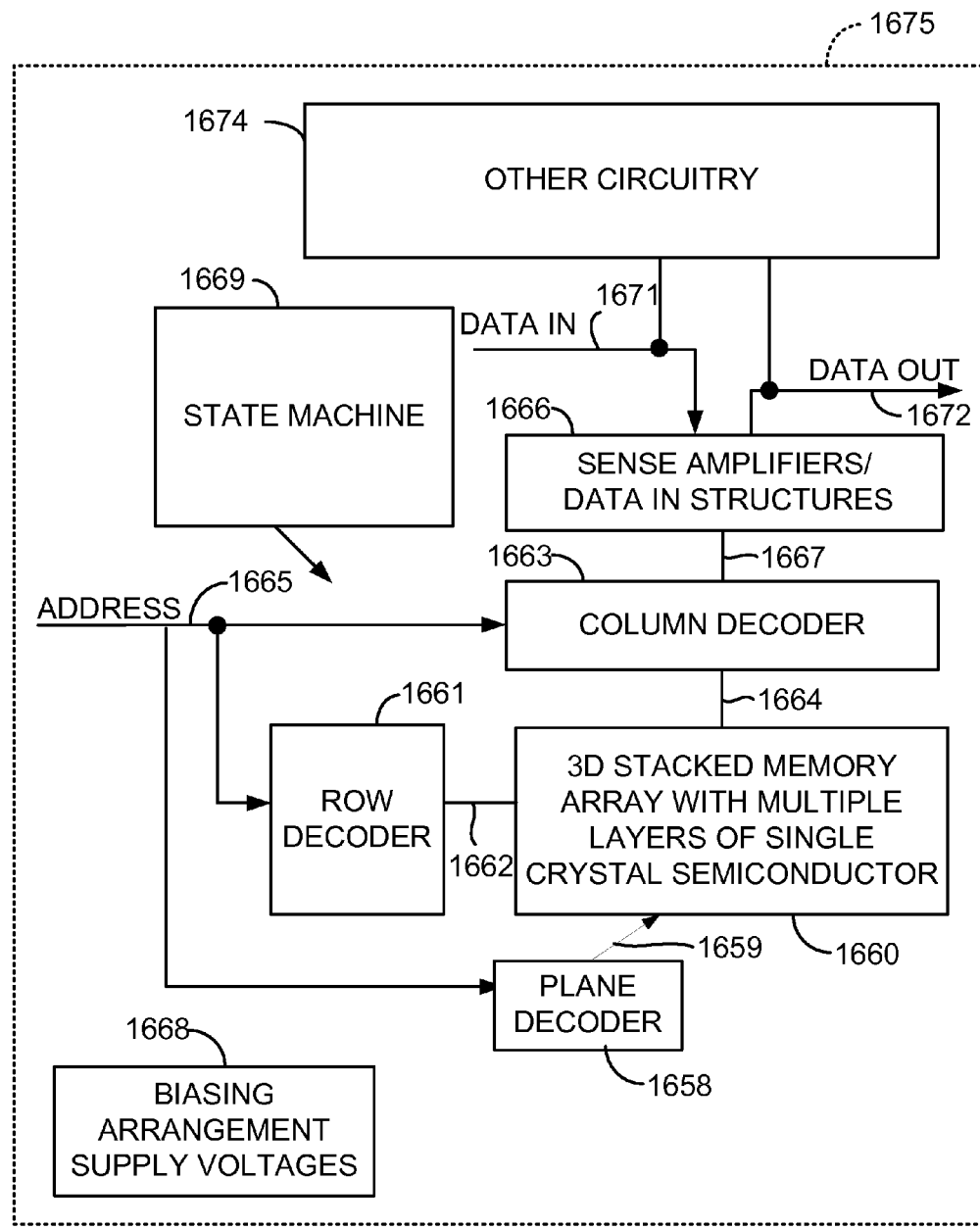
FIG. 16 is a simplified block diagram of an integrated circuit according to an embodiment of the present technology.

Additional back-end-of-line (BEOL) processing can then be performed to complete the chip. Generally, the structures formed by BEOL processes may include contacts, inter-layer dielectrics, and various metal layers for interconnections including access circuitry to couple the 3D array of memory cells to peripheral circuitry. As a result of these processes, control circuits, biasing circuits, and decoder circuits, such as those shown in FIG. 16, are formed on the device.

FIGS. 10-13 illustrate stages in an exemplary process flow for forming a 3D memory array utilizing the stacked single crystal structure illustrated in FIG. 9.

Figure 10:
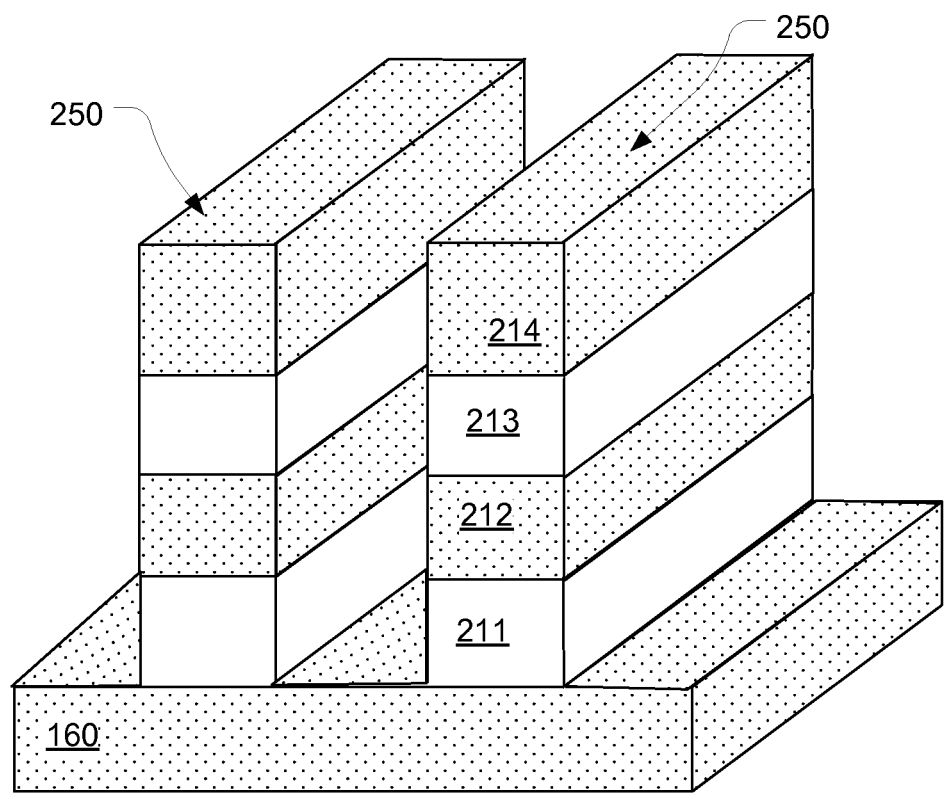
FIGS. 10-13 illustrate stages in an exemplary process flow for forming a 3D memory array utilizing the stacked single crystal structure illustrated in FIG. 9.

FIG. 10 shows the result of a first lithographic patterning step used to define a plurality of ridge-shaped stacks 250 of semiconductor material strips. The semiconductor material strips 211, 213 are implemented using the material of the semiconductor layers 261, 263, and separated by the insulating material 212, 214 of the insulating layers 262, 264.

Figure 11A:
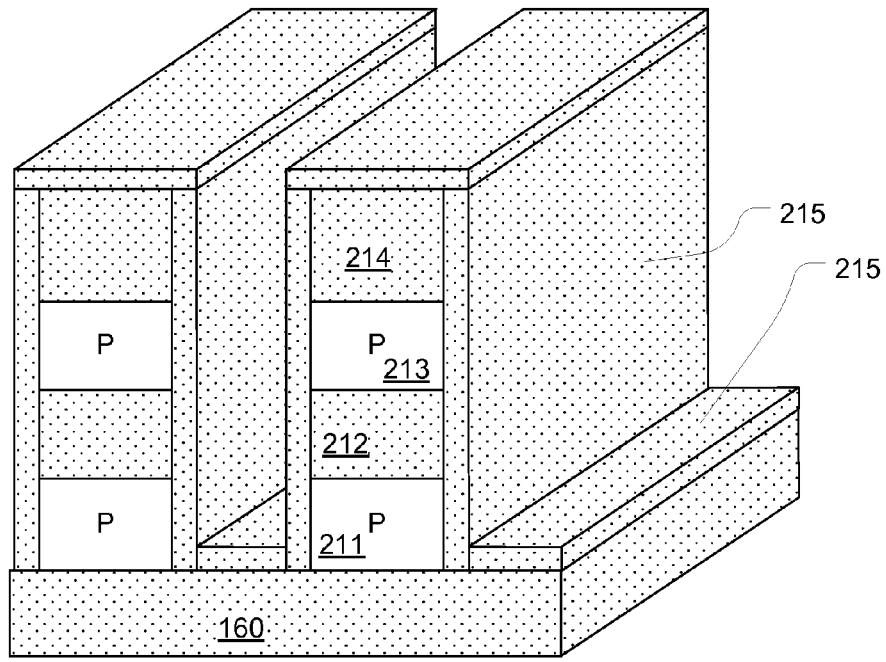
Figure 11B:
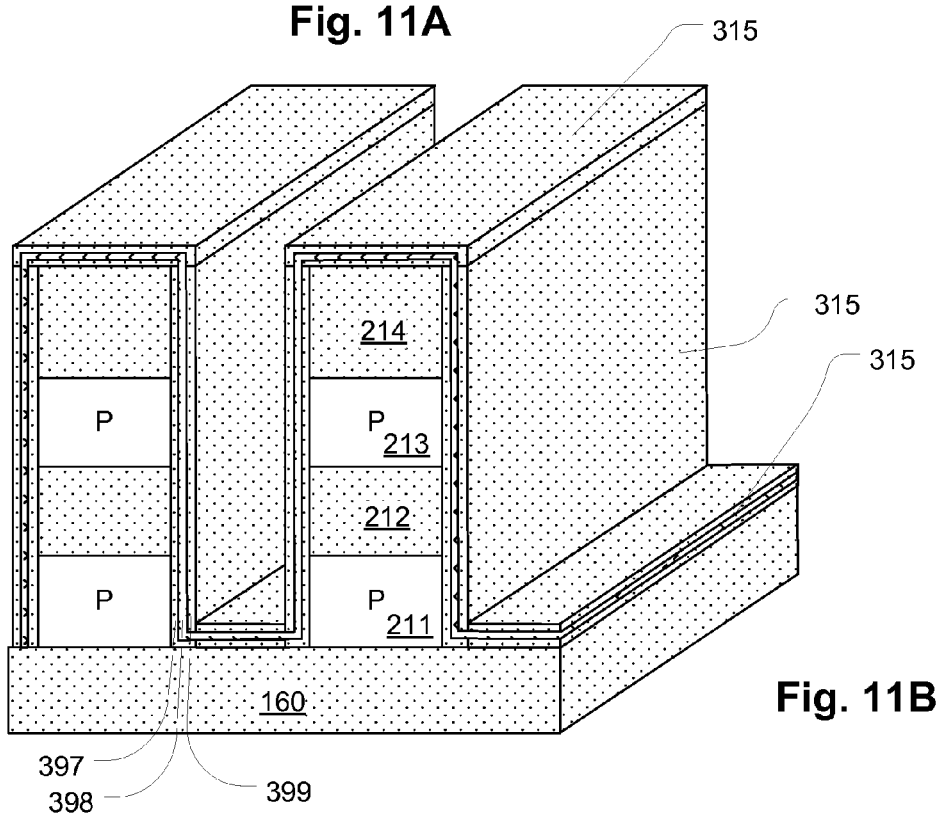

FIGS. 11A and 11B show the next stage for, respectively, an embodiment including a programmable resistance memory cell structure such as an anti-fuse cell structure, and an embodiment including a programmable charge trapping memory cell structure such as a SONOS type memory cell structure. In this example, the semiconductor strips 211, 213 are p-type. Alternatively, these strips 211, 213 may be n-type.

FIG. 11A shows results of a blanket deposition of a layer 215 of programmable resistance memory material. In this example, the layer 215 consists of a single layer of anti-fuse material. The anti-fuse material may be for example silicon dioxide, silicon nitride, silicon oxynitride or other silicon oxide. Alternatively, other types of programmable resistance memory materials may be formed.

In an alternative, rather than a blanket deposition, an oxidation process can be applied to form oxides on the exposed sides of the semiconductor material strips, where the oxides act as the memory material.

FIG. 11B shows results of blanket deposition of a layer 315 that comprises a multilayer charge trapping structure including a tunneling layer 397, a charge trapping layer 398 and a blocking layer 399. In the illustrated example, the tunneling layer 397 is silicon oxide (O), the charge storage layer 398 is silicon nitride (N), and the blocking dielectric layer 399 is silicon oxide (O). Alternatively, the layer 315 may comprise other charge storage structures, including for example silicon oxynitride ($Si_xO_yN_z$), silicon-rich nitride, silicon-rich oxide, trapping layers including embedded nano-particles and so on.

In one embodiment, a bandgap engineered SONOS (BE-SONOS) charge storage structure can be used which includes a dielectric tunneling layer 397 that includes a combination of materials forming an inverted "U" shaped valence band under zero bias. In one embodiment, the composite tunneling dielectric layer 397 includes a first layer referred to as a hole tunneling layer, a second layer referred to as a band offset layer, and a third layer referred to as an isolation layer. The hole tunneling layer of the layer 397 in this embodiment comprises silicon dioxide formed on the side surface of the semiconductor material strips using for example in-situ steam generation ISSG with optional nitridation by either a post deposition NO anneal or by addition of NO to the ambient during deposition. The thickness of the first layer of silicon dioxide is less than 20 Å, and preferably 15 Å or less. Representative embodiments can be 10 Å or 12 Å thick.

The band offset layer in this embodiment comprises silicon nitride lying on the hole tunneling layer, formed for example using low-pressure chemical vapor deposition LPCVD, using for example dichlorosilane DCS and $NH_3$ precursors at 680° C. In alternative processes, the band offset layer comprises silicon oxynitride, made using a similar process with an $N_2O$ precursor. The band offset layer thickness of silicon nitride is less than 30 Å, and preferably 25 Å or less.

The isolation layer in this embodiment comprises silicon dioxide, formed on the band offset layer of silicon nitride using for example LPCVD high temperature oxide HTO deposition. The thickness of the isolation layer of silicon dioxide is less than 35 Å, and preferably 25 Å or less. This three-layer tunneling layer results in an inverted U-shaped valence band energy level.

A charge trapping layer 398 in the layer 315 of memory material in this embodiment comprises silicon nitride having a thickness greater than 50 Å, including for example about 70 Å in this embodiment formed for example using LPCVD.

The blocking dielectric layer 399 in the layer 315 of memory material in this embodiment comprises a layer of silicon dioxide having a thickness greater than 50 Å, including for example about 90 Å in this embodiment, can be formed by wet conversion from the nitride by a wet furnace oxidation process. Other embodiments may be implemented using high temperature oxide (HTO) or LPCVD $SiO_2$. Other blocking dielectrics can include high-κ materials like aluminum oxide.

Figure 12:
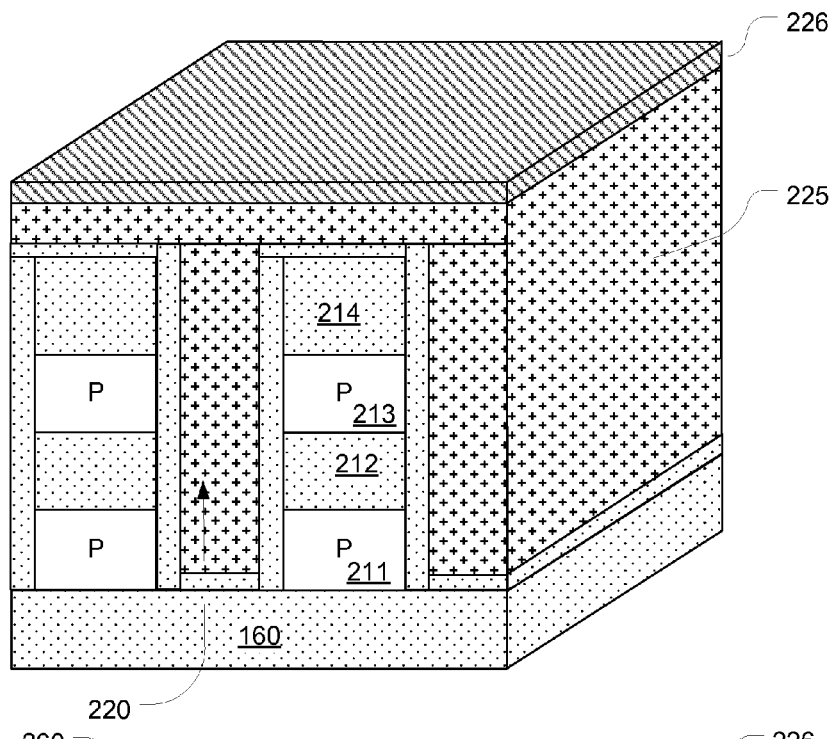

FIG. 12 shows the results of depositing conductive material, such as polysilicon having n-type or p-type doping, to form layer 225 to be used for conductive lines which will act as word lines. Also, a layer of silicide 226 can be formed over the layer 225 in embodiments in which polysilicon is utilized. As illustrated in the figure, high aspect ratio deposition technologies such as low-pressure chemical vapor deposition of polysilicon can be utilized to completely fill the trenches 220 between the ridge-shaped stacks.

Figure 13:
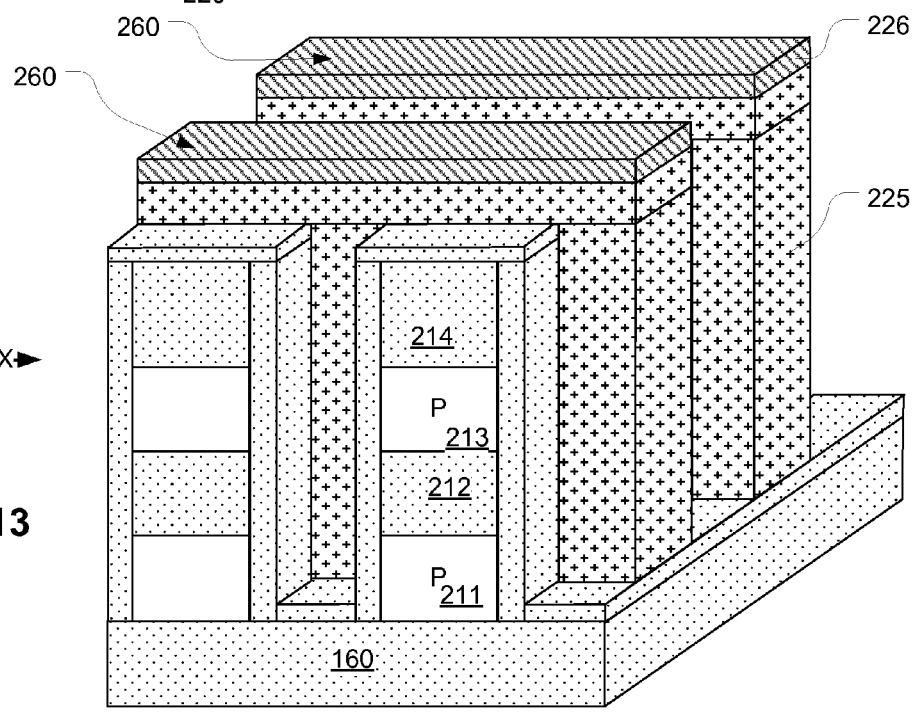

FIG. 13 shows results of the second lithographic patterning step used to define a plurality of conductive lines 260 which act as word lines for the 3D memory array. The second lithographic patterning step utilizes a single mask for critical dimensions of the array by etching high aspect ratio trenches between the conductive lines, without etching through the ridge-shaped stacks. Polysilicon can be etched using an etch process that is highly selective for polysilicon over silicon oxides or silicon nitrides. Thus, alternating etch processes are used, relying on the same mask to etch through the semiconductor and insulating layers, with the process stopping on the underlying insulating layer 160.

In the illustrated example, the layer of memory material between the lines 260 remains on the side surfaces of the semiconductor material strips. Alternatively, the layer of memory material between the lines 260 may be removed to expose the side surfaces of the semiconductor material strips during the formation of the lines 260.

Next, BEOL processes, such as those discussed above, are performed to complete the semiconductor process steps of the chip.

In the illustrated example, the layer 225 is formed on the structure illustrated in FIG. 11A. As a result, a 3D array of diode memory cells is formed. The memory cells comprise a rectifier formed by the p-n junction at the cross-points between the single crystal strips and the polysilicon lines, with a programmable anti-fuse layer in between the anode and cathode. In other embodiments, different programmable resistance memory materials can be used, including transition metal oxides like tungsten oxide. Such materials can be programmed and erased, and can be implemented for operations storing multiple bits per cell.

The layer 225 can also be formed on the structure illustrated in FIG. 11B. In such a case, a 3D array of charge trapping memory cells is formed. Transistors are defined by the single crystal semiconductor material strips and the polysilicon lines. The semiconductor material strips act as the source, drain and channel of the transistors. The polysilicon lines act as the gates of the transistors.

Figure 14:
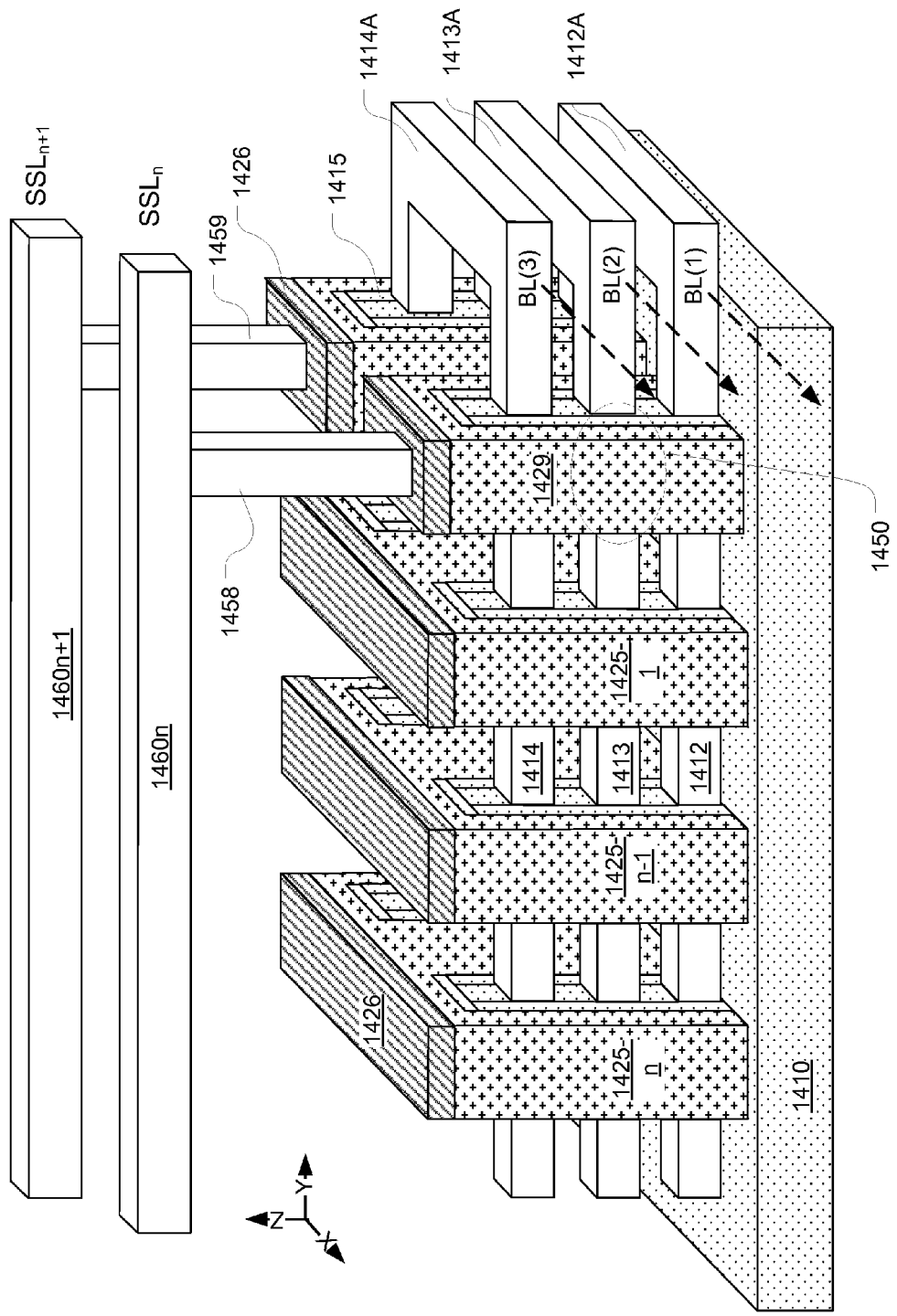
FIG. 14 is a perspective view showing the manner in which the semiconductor material strips are connected in one decoding structure.

FIG. 14 is a perspective view showing the manner in which the semiconductor material strips are connected together in one decoding structure. Alternatively, other decoding layouts may be utilized. In some embodiments the decoding layouts described in U.S. application Ser. No. 13/018,110 are utilized, which is incorporated by reference herein.

The perspective in FIG. 14 is rotated 90 degrees on the Z-axis, so that the Y- and Z-axes lie in the plane of the paper, as compared to the orientation of earlier figures in which the X- and Z-axes lie in the plane of the paper.

Also, the insulating layers between the semiconductor strips, in the ridge-shaped stacks are removed from the drawing to expose additional structure.

The multilayer array is formed on an insulating layer 1410, and includes a plurality of conductive lines 1425-1, . . . , 1425-n-1, 1425-n conformal with the plurality of ridge-shaped stacks, and which act as word lines WLn, WLn-1, . . . WL1. The plurality of ridge-shaped stacks includes semiconductor strips 1412, 1413, 1414, which are coupled to the semiconductor strips in the same plane in parallel ridge-shaped stacks by extensions 1412A, 1413A, 1414A. In another embodiment, the extensions form a staircase structure terminating the strips. These extensions 1412A, 1413A, 1414A of the semiconductor strips are oriented along the X-axis direction, coupled to the plurality of ridge-shaped stacks of semiconductor material strips. Also, these extensions 1412A, 1413A, 1414A extend beyond the edge of the array, and are arranged for connection to decoding circuitry to select planes within the array. These extensions 1412A, 1413A, 1414A can be patterned at the same time that the plurality of ridge-shaped stacks are defined, or before. In another embodiment, with the extensions that form a staircase structure terminating the strips, it is unnecessary for the extensions to extend beyond the edge of the array.

A layer of memory material 1415 separates the conductive lines 1425-1 through 1425-n, from the semiconductor material strips 1412-1414.

Transistors, e.g. transistor 1450, are formed between the semiconductor strips 1412, 1413, 1414 and the conductive line 1425-1. In the transistors, the semiconductor strip (e.g. 1413) acts as the channel region of the device. Gate structures (e.g. 1429) are patterned during the same step that the conductive lines 1425-1 through 1425-n are defined. A layer of silicide 1426 can be formed along the top surface of the conductive lines, and over the gate structures 1429. The layer of memory material 1415 can act as the gate dielectric for the transistors. These transistors act as select gates coupled to decoding circuitry for selecting columns along the ridge-shaped stacks in the array.

Contact plugs 1458, 1459 are on the top surfaces of the gate structures 1429. Overlying metal lines 1460n, 1460n+1 are patterned to connect as SSL lines, to column decoder circuits. A three-plane decoding network is established in the illustrated manner, accessing a selected cell using one word line, one bit line and one SSL line. See, U.S. Pat. No. 6,906,940, entitled Plane Decoding Method and Device for Three Dimensional Memories.

Figure 15:
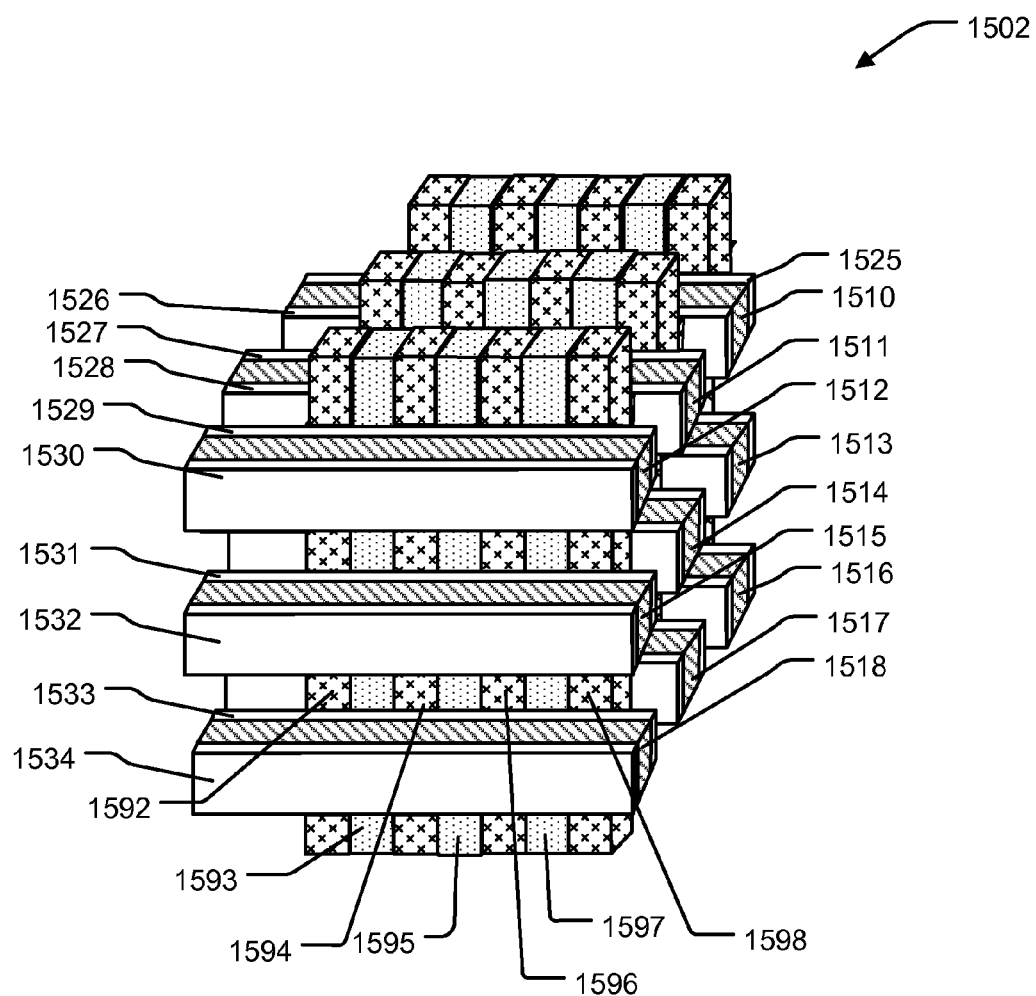
FIG. 15 is a perspective view of an implementation of a portion of a 3D stacked vertical NAND memory array having multiple levels of single crystal semiconductor word lines.
Figure 15:
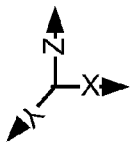

FIG. 15 is a perspective view of an implementation of a portion of a 3D stacked vertical NAND memory array 1502 having multiple levels of single crystal semiconductor word lines. The memory structure 1502 includes an array of semiconductor pillars, including pillars 1593, 1595 and 1597. Insulating pillars, including insulating pillars 1592, 1594, 1596, and 1598, are formed between the semiconductor pillars. Each semiconductor pillar provides multiple levels of cells arranged a pair of vertical NAND strings.

A given semiconductor pillar (e.g. 1595) includes a plurality of dielectric charge trapping structures arranged in a first vertical NAND string along a first side of the pillar 495, and a second vertical NAND string along a second side of the pillar 495. Single crystal word lines (e.g. word line 1518) are adjacent the charge trapping structures of the semiconductor pillars, so that memory cells are formed at the cross-points of the sides of the semiconductor pillars and word lines in each level, with dielectric charge trapping structures in between. Insulating material (not shown) separate the different levels of word lines from one another.

Three levels of word lines are illustrated, where a top level includes word lines 1510, 1511 and 1512 extending in the X-direction, a next lower level includes word lines 1513, 1514 and 1515, and a bottom level includes word lines 1516, 1517 and 1518. Charge storage structures 1525-1530 are formed on opposing sides of the word lines 1510-1512 on the top level. Charge storage structures 1531-1532 are formed on opposing sides of word line 1515, and charge storage structures 1533-1534 are formed on opposing sides of word line 1518. Similar charge storage structures are formed on the sides of the other word lines in the structure as well.

During manufacturing of the memory array 1502, the techniques described above are performed to stack multiple layers of single crystal semiconductor word line material separated by insulating material. Additional processing is then performed on the multi-layer structure to form the 3D memory array 1502 illustrated in FIG. 15. In the illustrated example, the additional processing is performed as described in U.S. patent application Ser. No. 12/785,291, which is incorporated by reference herein.

The techniques described herein for forming stacked layers of single crystal can also be utilized in a variety of other 3D memory architectures. For example, the techniques described herein can be implemented to form 3D stacked thin film transistor structures as described in U.S. Pat. Nos. 7,473,589 and 7,709,334, the disclosures of which are incorporated by reference herein.

FIG. 16 is a simplified block diagram of an integrated circuit 1675 according to an embodiment of the present technology. The integrated circuit 1675 includes a 3D staked memory array with multiple layers of single crystal silicon manufactured as described herein. A row decoder 1661 is coupled to a plurality of word lines 1662, and arranged along rows in the memory array 1660. A column decoder 1663 is coupled to a plurality of bit lines 1664 arranged along columns in the memory array 1660 for reading and programming data from the memory cells in the array 1660. A plane decoder 1658 is coupled to a plurality of planes in the memory array 1660 on SSL lines 1659. Addresses are supplied on bus 1665 to column decoder 1663, row decoder 1661 and plane decoder 1658. Sense amplifiers and data-in structures in block 1666 are coupled to the column decoder 1663 in this example via data bus 1667. Data is supplied via the data-in line 1671 from input/output ports on the integrated circuit 1675 or from other data sources internal or external to the integrated circuit 1675, to the data-in structures in block 1666. In the illustrated embodiment, other circuitry 1674 is included on the integrated circuit, such as a general purpose processor or special purpose application circuitry, or a combination of modules providing system-on-a-chip functionality supported by the array. Data is supplied via the data-out line 1672 from the sense amplifiers in block 1666 to input/output ports on the integrated circuit 1675, or to other data destinations internal or external to the integrated circuit 1675.

A controller implemented in this example using bias arrangement state machine 1669 controls the application of bias arrangement supply voltage generated or provided through the voltage supply or supplies in block 1668, such as read and program voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

The invention claimed is:

1. A method for manufacturing a memory device, the method comprising:
bonding a first single crystal semiconductor body to a surface of a first layer of insulating material, and splitting the first single crystal semiconductor body on a plane generally parallel to the surface of the first layer of insulating material, leaving a first layer of single crystal semiconductor bonded on the first layer of insulating material;
forming a second layer of insulating material on the first layer of single crystal semiconductor material;
bonding a second single crystal semiconductor body to a surface of the second layer of insulating material, and splitting the second single crystal semiconductor body on a plane generally parallel to the surface of the second layer of insulating material, leaving a second layer of single crystal semiconductor bonded on the second layer of insulating material; and
processing the first and second layers of single crystal semiconductor layer to form a 3D memory array.

2. The method of claim 1, further comprising implanting ions to form a defect layer within the first single crystal semiconductor body prior to bonding to surface of the first layer of insulating material, and after bonding to the surface of the first layer of insulating material, splitting the substrate at the defect layer to leave the first layer of single crystal semiconductor material bonded on the first layer of insulating material.

3. The method of claim 2, wherein implanting ions comprises implanting hydrogen ions.

4. The method of claim 2, wherein splitting the first single crystal semiconductor body at the defect layer comprises annealing to induce the splitting at the defect layer.

5. The method of claim 1, wherein processing the first and second layers of single crystal semiconductor material includes:
etching the first and second layers of single crystal semiconductor material to define a plurality of stacks of single crystal semiconductor material strips separated by the insulating material;
forming a plurality of conductive lines overlying the plurality of stacks; and
forming memory elements adjacent the plurality of stacks, which establish a 3D array of memory cells accessible via the plurality of single crystal semiconductor material strips and the plurality of conductive lines.

6. The method of claim 5, wherein:
forming the plurality of conductive lines establishes a 3D array of interface regions at cross-points between surfaces of the single crystal semiconductor material strips and the plurality of conductive lines; and
the memory elements are formed in the interface regions.

7. The method of claim 6, wherein:
forming the memory elements comprises forming a memory layer on sides of single crystal semiconductor material strips in the plurality of stacks; and
forming the plurality of conductive lines over and having a surface conformal with the memory layer on the plurality of stacks.

8. The method of claim 7, wherein the memory layer comprises a layer of anti-fuse material.

9. The method of claim 7, wherein the memory layer includes a multilayer charge storage structure.

10. The method of claim 5, wherein the single crystal semiconductor material strips comprise a doped semiconductor material having a first conductivity type and the plurality of conductive lines comprise a doped semiconductor material having a second conductivity type establishing a p-n junction in said interface regions.

11. The method of claim 5, wherein the single crystal semiconductor material strips comprise a doped semiconductor so that the strips are arranged for operation of the memory cells as charge storage transistors.

12. The method of claim 1, wherein the second single crystal semiconductor body is a remaining portion of the first single crystal semiconductor body after leaving the first layer of single crystal semiconductor.

13. A method for manufacturing a memory device, the method comprising:
forming a plurality of stacked layers of single crystal semiconductor material, wherein forming each particular layer of single crystal semiconductor material in the plurality comprises bonding a single crystal semiconductor body to a layer of insulating material, and splitting the single crystal semiconductor body such that the particular layer of the single crystal semiconductor material remains on the layer of the insulating material;
etching the plurality of layers to define a plurality of stacks of single crystal semiconductor material strips;
forming a plurality of conductive lines overlying the plurality of stacks, such that a 3D array of interface regions is established at cross-points between surfaces of the single crystal semiconductor material strips and the plurality of conductive lines; and
forming memory elements in the interface regions, which establish a 3D array of memory cells accessible via the plurality of single crystal semiconductor material strips and the plurality of conductive lines.

14. A memory device manufactured by a method comprising:
bonding a first single crystal semiconductor body to a surface of a first layer of insulating material, and splitting the first single crystal semiconductor body on a plane generally parallel to the surface of the first layer of insulating material, leaving a first layer of single crystal semiconductor bonded on the first layer of insulating material;

forming a second layer of insulating material on the first layer of single crystal semiconductor material;

bonding a second single crystal semiconductor body to a surface of the second layer of insulating material, and splitting the second single crystal semiconductor body on a plane generally parallel to the surface of the second layer of insulating material, leaving a second layer of single crystal semiconductor bonded on the second layer of insulating material; and processing the first and second layers of single crystal semiconductor layer to form a 3D memory array.

15. The memory device of claim 14, wherein the method further comprises implanting ions to form a defect layer within the first single crystal semiconductor body prior to bonding to surface of the first layer of insulating material, and after bonding to the surface of the first layer of insulating material, splitting the substrate at the defect layer to leave the first layer of single crystal semiconductor material bonded on the first layer of insulating material.

16. The memory device of claim 15, wherein implanting ions comprises implanting hydrogen ions.

17. The memory device of claim 15, wherein splitting the first single crystal semiconductor body at the defect layer comprises annealing to induce the splitting at the defect layer.

18. The memory device of claim 14, wherein processing the first and second layers of single crystal semiconductor material includes:

etching the first and second layers of single crystal semiconductor material to define a plurality of stacks of single crystal semiconductor material strips separated by the insulating material;

forming a plurality of conductive lines overlying the plurality of stacks; and forming memory elements adjacent the plurality of stacks, which establish a 3D array of memory cells accessible via the plurality of single crystal semiconductor material strips and the plurality of conductive lines.

19. The memory device of claim 18, wherein:

forming the plurality of conductive lines establishes a 3D array of interface regions at cross-points between surfaces of the single crystal semiconductor material strips and the plurality of conductive lines; and the memory elements are formed in the interface regions.

20. The memory device of claim 19, wherein:

forming the memory elements comprises forming a memory layer on sides of single crystal semiconductor material strips in the plurality of stacks; and forming the plurality of conductive lines over and having a surface conformal with the memory layer on the plurality of stacks.

21. The memory device of claim 20, wherein the memory layer comprises a layer of anti-fuse material.

22. The memory device of claim 20, wherein the memory layer includes a multilayer charge storage structure.

23. The memory device of claim 18, wherein the single crystal semiconductor material strips comprise a doped semiconductor material having a first conductivity type and the plurality of conductive lines comprise a doped semiconductor material having a second conductivity type establishing a p-n junction in said interface regions.

24. The memory device of claim 18, wherein the single crystal semiconductor material strips comprise a doped semiconductor so that the strips are arranged for operation of the memory cells as charge storage transistors.

25. The memory device of claim 14, wherein the second single crystal semiconductor body is a remaining portion of the first single crystal semiconductor body after leaving the first layer of single crystal semiconductor.

* * * * *

UNITED STATES PATENT AND TRADEMARK OFFICE
CERTIFICATE OF CORRECTION

| | |
|---|---|
| PATENT NO. | : 8,486,791 B2 |
| APPLICATION NO. | : 13/223116 |
| DATED | : July 16, 2013 |
| INVENTOR(S) | : Hang-Ting Lue |

It is certified that error appears in the above-identified patent and that said Letters Patent is hereby corrected as shown below:

On the title page, Title, item (54), and in the specification, column 1, line 1, remove "MUFTI-LAYER", and insert -- MULTI-LAYER --.

Signed and Sealed this
Twentieth Day of May, 2014

Michelle K. Lee
*Deputy Director of the United States Patent and Trademark Office*